(12) United States Patent
Kim et al.

(10) Patent No.: US 8,737,157 B2
(45) Date of Patent: May 27, 2014

(54) MEMORY DEVICE WORD LINE DRIVERS AND METHODS

(75) Inventors: Tae Kim, Boise, ID (US); Howard C. Kirsch, Eagle, ID (US); Charles L. Ingalls, Meridian, ID (US); Shigeki Tomishima, Portland, OR (US); K. Shawn Smith, Boise, ID (US)

(73) Assignee: Micron Technology, Inc., Boise, ID (US)

(*) Notice: Subject to any disclaimer, the term of this patent is extended or adjusted under 35 U.S.C. 154(b) by 119 days.

(21) Appl. No.: 13/298,104

(22) Filed: Nov. 16, 2011

(65) Prior Publication Data

US 2012/0063256 A1    Mar. 15, 2012

Related U.S. Application Data

(63) Continuation-in-part of application No. 13/100,874, filed on May 4, 2011, now abandoned, which is a continuation-in-part of application No. 12/774,618, filed on May 5, 2010, now abandoned.

(51) Int. Cl.
*G11C 8/00* (2006.01)
*G11C 16/06* (2006.01)

(52) U.S. Cl.
USPC .................................. 365/230.06; 365/185.23

(58) Field of Classification Search
USPC .................................................. 365/230.06
See application file for complete search history.

(56) References Cited

U.S. PATENT DOCUMENTS

| | | | |
|---|---|---|---|
| 5,867,445 A | 2/1999 | Kirsch et al. | |
| 6,011,746 A | 1/2000 | Oh | |
| 6,025,751 A | 2/2000 | Chiang et al. | |
| 6,046,956 A | 4/2000 | Yabe | |
| 6,055,203 A * | 4/2000 | Agarwal et al. | 365/230.06 |
| 6,160,753 A | 12/2000 | Shibayama | |
| 6,320,783 B1 * | 11/2001 | Kang et al. | 365/145 |
| 7,002,825 B2 * | 2/2006 | Scheuerlein | 365/51 |
| 7,215,592 B2 * | 5/2007 | Cho et al. | 365/230.06 |
| 7,447,104 B2 | 11/2008 | Leung | |
| 7,474,556 B2 * | 1/2009 | Choi et al. | 365/163 |
| 7,633,788 B2 * | 12/2009 | Choi et al. | 365/148 |
| 2007/0165479 A1 | 7/2007 | Rehm | |

OTHER PUBLICATIONS

U.S. Appl. No. 13/100,874, filed May 4, 2011 Title: Memory Device Word Line Drivers and Methods.
U.S. Appl. No. 12/774,618, filed May 5, 2010; Title: Memory Device Word Line Drivers and Methods.

* cited by examiner

*Primary Examiner* — Son Mai
(74) *Attorney, Agent, or Firm* — Dorsey & Whitney LLP (57) ABSTRACT

Memory subsystems and methods, such as those involving a memory cell array formed over a semiconductor material of a first type, such as p-type substrate. In at least one such subsystem, all of the transistors used to selectively access cells within the array are transistors of a second type, such as n-type transistors. Local word line drivers are coupled to respective word lines extending through the array. Each local word line drivers includes at least one transistor. However, all of the transistors in the local word line drivers are of the second type. A well of semiconductor material of the second type, is also formed in the material of the first type, and a plurality of global word line drivers are formed using the well. Other subsystems and methods are disclosed.

38 Claims, 11 Drawing Sheets

Figure 15

MEMORY DEVICE WORD LINE DRIVERS AND METHODS

CROSS-REFERENCE TO RELATED APPLICATION

This application is a continuation-in-part of U.S. patent application Ser. No. 13/100,874, filed May 4, 2011, which application is a continuation-in-part of U.S. patent application Ser. No. 12/774,618, filed May 5, 2010. These applications are incorporated by reference herein in their entirety and for any purpose.

TECHNICAL FIELD

Embodiments of this invention relate to word line drivers and methods of driving a word line in a memory device.

BACKGROUND OF THE INVENTION

Signal drivers for applying a signal to a signal line are in common use in electronic devices, such as integrated circuits. For example, a memory device may employ a variety of signal drivers to apply signals to a variety of circuits. One such signal driver may be used to apply voltages to word lines in an array of memory cells. The word lines may extend through a memory cell array from a set of global word line drivers. The global word line driver may selectively actuate each of the word lines responsive to the memory device receiving a row address corresponding to the word line. Each of the memory cells in the row corresponding to the received row address then applies stored data to a respective sense amplifier.

Each of the word lines extending through the array may be relatively long and, as a result, may have substantial capacitance. Furthermore, the word lines may be fabricated of polysilicon, which may have a relatively high resistance. The combination of the relatively high capacitance and relatively high resistance of the word lines may make it difficult for the global word line driver to quickly switch signal levels on the word lines, particularly in portions of the memory cell array that are more distant from the global word line driver. To alleviate this problem, it is conventional for memory cell arrays to be divided into smaller memory cell arrays, and to fabricate local word line drivers between at least some of these smaller memory cell arrays. The local word line drivers may receive substantially the same signals that are used to control the global word line drivers to drive the word lines so that they may apply the same levels to the word lines that the global word line driver applies to the word lines.

Although the use of local word line drivers may improve the switching speed of word lines, prior art designs generally include both at least one PMOS transistor and at least one NMOS transistor in each local word line driver. Also, access transistors coupled to the word lines and used to couple the memory cells in the arrays to the digit lines are often NMOS transistors formed in a p-type substrate. The NMOS transistors in the local word line drivers may also be fabricated in the same p-type substrate. However, fabricating the PMOS transistors in the local word drivers may require the fabrication of an n-well in the p-type substrate to provide n-type material in which the PMOS transistors may be fabricated. Yet forming a n-well for each of the local word line drivers can greatly increase the area of a semiconductor substrate required to fabricate the local word line drivers, thereby potentially either increasing the cost or reducing the capacity of memory devices using local word line drivers

DETAILED DESCRIPTION

Figure 1:
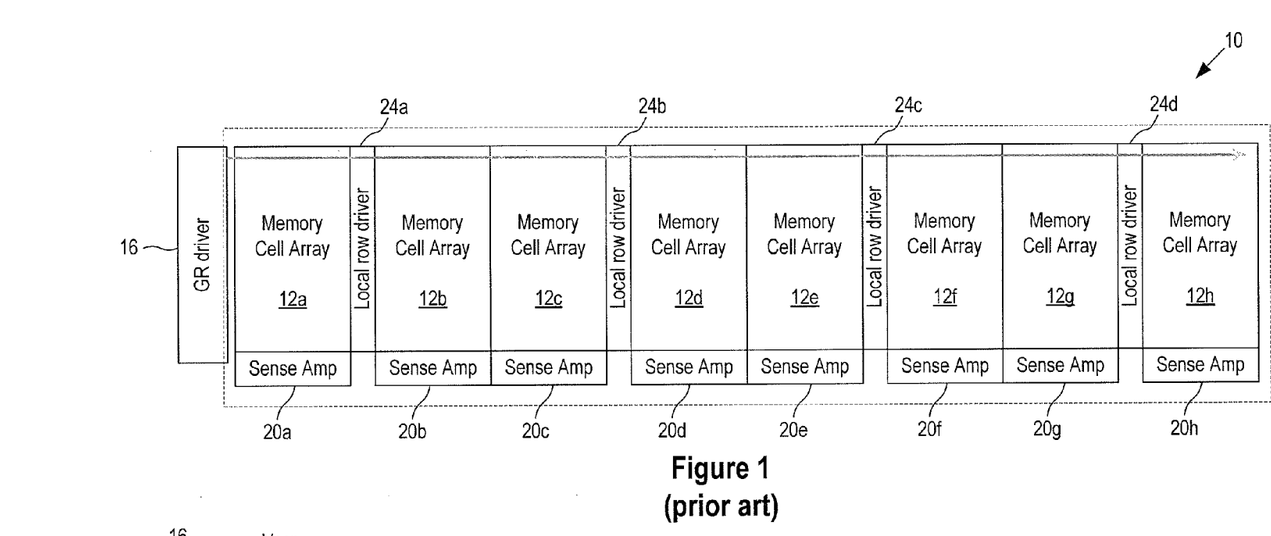
FIG. 1 is a schematic drawing of a layout for a portion of a prior art memory device.

A typical layout for a portion of a prior art memory device is shown in FIG. 1. The portion shown is a memory subsystem 10 containing a set of memory cell arrays 12a-h, although other memory subsystems may have different configurations. The memory cells in the memory cell arrays 12a-h can be any of a variety of memory cells, such as SRAM memory cells, DRAM memory cells, flash memory cells, etc. A plurality of word lines (not shown in FIG. 1) may extend from a set of global word line drivers 16 through all of the memory cell arrays 12a-h. A set of data (e.g., a digit, such as a bit) lines (not shown in FIG. 1) may extend from each of a plurality of sets of sense circuits (e.g., amplifiers) 20a-h through a respective one of the memory cell arrays 12a-h. Each set of sense circuits 20a-h may include a sense amplifier (not shown in FIG. 1) for each column of memory cells in the respective memory cell array 12a-h, which may be coupled to the memory cells in the respective column by a digit line or pair of digit lines.

In operation, a first portion of an addresses, such as a row address, may be decoded and used to select a corresponding word line. One of the global word line drivers 16 may then output an actuating signal on the respective word line selected by the row address. The actuating signal on the word line may then cause each of the memory cells in the corresponding row to apply respective stored data to a respective sense amplifier in the respective set of sense circuits 20a-h.

As explained above, each of the word lines extending through the arrays 12a-b from the global word line drivers 16 may have substantial capacitance and resistance, which may reduce the speed at which the global word line drivers 16 may drive the word lines. To alleviate this problem, local word line drivers 24a-d may be fabricated between at least some of the memory cell arrays 12a-h. The local word line drivers 24a-d may receive substantially the same signals that are used to control the global word line drivers 16 to drive the word lines so that they may apply the same levels to the word lines that the global word line drivers 16 apply to the word lines.

Figure 2:
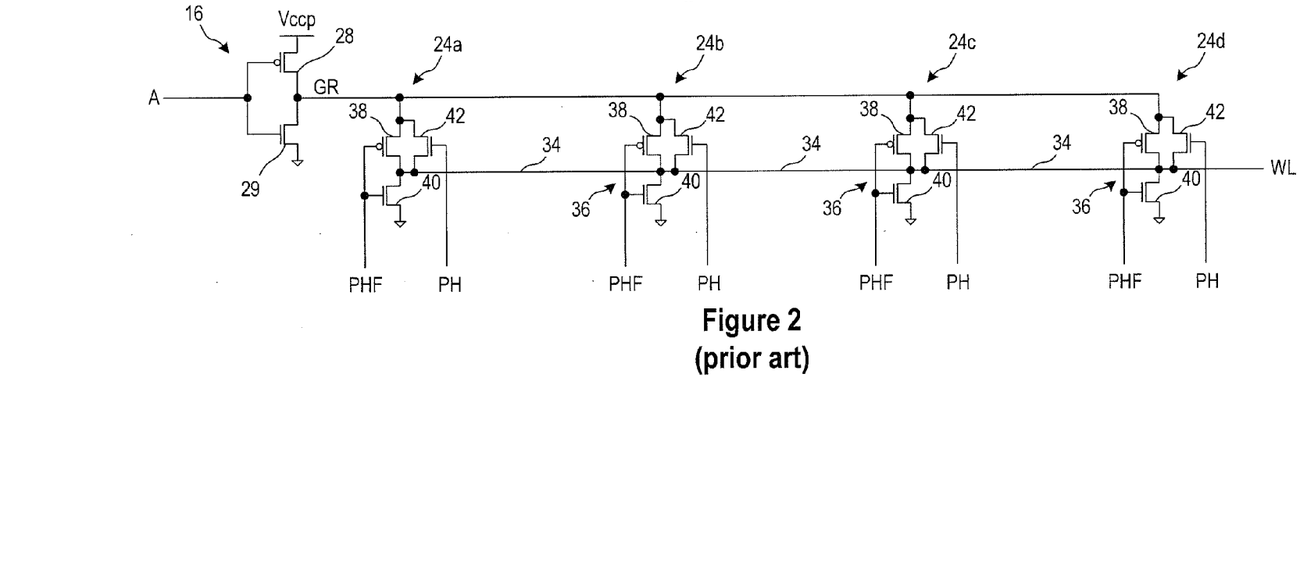
FIG. 2 is a schematic of circuitry used in some of the portions of the prior art memory device shown in FIG. 1.

An example of a typical prior art global word line driver 16 and a typical prior art set of local word line drivers 24a-d is shown in FIG. 2. The global word line driver 16 may include a transistor of a first type, such as a p-type (e.g., PMOS) transistor 28, having a source coupled to a voltage, such as Vccp and a drain coupled to a drain of a transistor of a second type that is different from the first type, such as an n-type (e.g., NMOS) transistor 29. The interconnected drains of the transistors 28, 29 are coupled to a global word line GR. The gates of the transistors 28, 29 receive a global control signal A, which may be driven high to couple the global word line GR to a supply voltage such as ground or low to couple the global word line GR to a second supply voltage, such as Vccp.

Each of the local word line drivers 24a-d may include an inverter 36 formed by a PMOS transistor 38 coupled between the global word line GR and the local word line 34, and transistor of a second type, such as an n-type (e.g., NMOS) transistor 40, coupled between the local word line 34 and a supply voltage node, such as ground. A second NMOS transistor 42 may be coupled between the global word line GR and the local word line 34. The gate of the transistor 42 may receive a signal PH that is the complement of the signal PHF.

In operation, the global word line driver 16 may drive the global word line either to ground responsive to the global control signal A being high or to Vccp responsive to the global control signal A being low. The local word line drivers 24a-d may drive the local word line 34 to ground responsive to the PH signal being low and the PHF signal being high. The low PH signal may turn OFF the transistor 42 in each of the drivers 24a-d. The high PHF signal may turn OFF the PMOS transistor 38 in each of the drivers 24a-d to isolate the local word line 34 from the global word line GR, and may turn ON the NMOS transistor 40 in each of the drivers 24a-d to couple the local word line 34 to ground.

The global word line driver 16 and the local word line drivers 24a-d may drive the local word line 34 to the voltage of the global word line GR (whether the word line has been driven either high or to ground) responsive to the PHF signal being low and the PH signal being high. If the global word line GR has been driven high, the low PHF signal may turn ON the PMOS transistor 38 to couple the local word line 34 to the voltage Vccp of the global word line GR, and it may turn OFF the NMOS transistor to isolate the local word line 34 from ground. At the same time, the high PH signal may turn ON the transistor 42 to also couple the local word line 34 to the global word line GR until the voltage of the local word line 34 reaches the voltage on the global word line GR less the threshold voltage of the transistor 42. If the global word line GR has been driven low, the low PHF signal may cause the PMOS transistor 38 and the NMOS transistor to be turned OFF, and the high PH signal may turn ON the transistor 42 to also couple the local word line 34 to the ground potential of the global word line GR. Regardless of the level to which the global word line GR has been driven, a high PHF signal may turn ON the NMOS transistor 40 to couple the word line to ground, and the corresponding low PH signal and the corresponding high PHF may turn OFF the transistors 38, 42 to isolate the local word line 34 from the global word line GR.

The fact that each of the local word line drivers 24a-d use two transistors 38, 42 to drive the local word line 34 high and only one transistor 40 to drive the local word line 34 low may raise concerns about a potential difference in the speed at which the word line is driven high relative to the speed at which the word line is driven low. However, in operation, the global word line GR may be driven to 0 volts between each memory access cycle by other circuitry (not shown). As a result, if the local word line 34 is to be inactive low during a memory access cycle, the NMOS transistors 40 need only maintain the local word line 34 at ground. Thus, the transistors 40 need not switch the local word line 34 to ground. Conversely, if the local word line 34 is to be active high during a memory access cycle, the global word line GR may be driven to a positive voltage, such as VCCP.

Figure 3A:
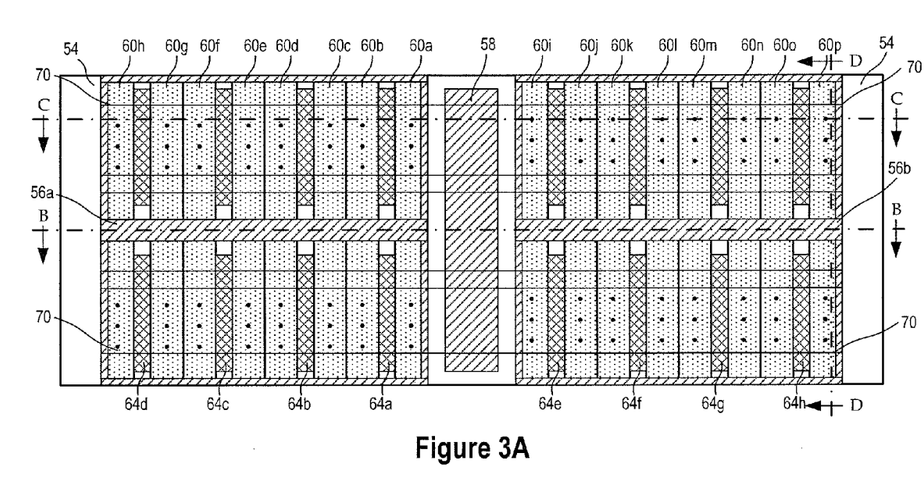
FIG. 3A is a schematic drawing of a layout for a portion of a memory device according to another embodiment.
Figure 3B:
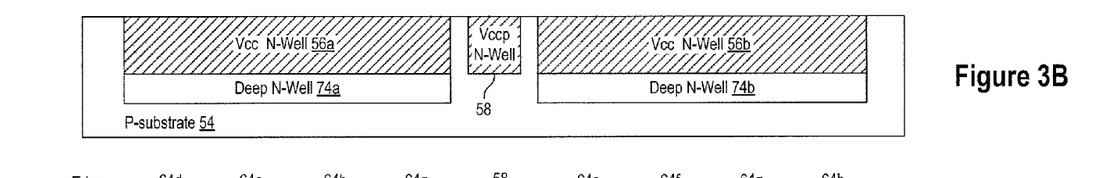
FIG. 3B is a cross-sectional view taken along the line B-B of FIG. 3A.
Figure 3C:
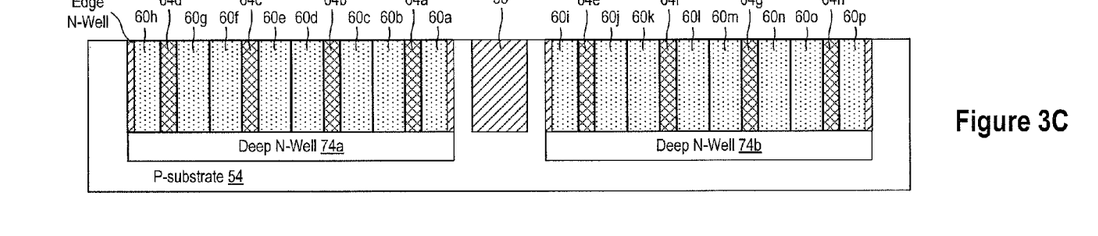
FIG. 3C is a cross-sectional view taken along the line C-C of FIG. 3A.
Figure 3D:
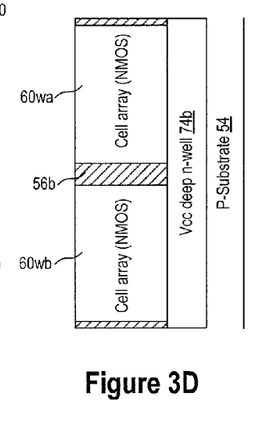
FIG. 3D is a cross-sectional view taken along the line D-D of FIG. 3A.

As mentioned above, the need to include the PMOS transistor 38 in each of the local word line drivers 24a-d for each of a large number of word lines may require an n-well in a p-well from which the memory cell arrays 12a-h are formed, thereby causing the disadvantages described above. One embodiment of a portion of a memory subsystem 50 that may avoid all or some of the disadvantages of conventional memory devices is shown in FIGS. 3A-D, in which FIG. 3A is a plan view, and FIGS. 3B, 3C and 3D are cross-sectional views taken along the lines B-B, C-C, and D-D, respectively. As shown therein, p-wells in which both local word line drivers of the second type and memory cell arrays of the second type are formed do not contain n-wells. Specifically, a semiconductor material of a first type, such as a p-type substrate 54, may have formed therein two sets of wells of a second type, such as n-wells 56a,b, extending across each side of the p-type substrate 54, and a single n-well 58 in the middle of the p-type substrate 54 between the n-wells 56a,b. The sets of n-wells 56a,b may be used to form transistors of a first type, such as p-type (e.g., PMOS) transistors, such as those used in sense amplifiers (not shown), and the n-well 58 may be used to form transistors of a first type, such as p-type (e.g., PMOS) transistors, such as those used in row address decoders and global word line drivers. Also formed over the substrate 54 are two p-type wells 60wa, 60wb over which are formed a plurality of memory cell arrays 60a-h and 60i-p on opposite sides of the n-well 58. A plurality of local word line drivers 64a-d and 64e-h may also be formed using the p-type substrate 54 between some of the memory cell arrays 60a-h and 60i-p, respectively. All of the transistors in the memory cell arrays 60a-h and 60i-p may be transistors of a second type, such as n-type (e.g., NMOS) transistors, and, as explained below, all of the transistors in the local word line drivers 64a-d and 64e-h are transistors of the second type, such as n-type (e.g., NMOS) transistors. Although the embodiment shown in FIGS. 3A-D uses n-wells 56a,b and 58 as the wells of the second type, with all of their attendant disadvantages, the use of the n-wells may be confined to use of sense amplifiers, row decoders and global word line drivers. In the embodiment of FIGS. 3A-C, n-wells may not be needed for the local word line drivers 64a-d and 64e-h. As a result, the storage density of a memory device using the memory subsystem 50 may be relatively high.

As also shown in FIG. 3A, a plurality of local word lines 70 may extend in opposite directions from the global word line drivers (not shown in FIG. 3A) formed using the n-well 58 through the memory cell arrays 60a-h and 60i-p and the local word line drivers 64a-d and 64e-h. As shown in FIGS. 3B and 3D, deep n-wells 74a,b may be formed in the substrate 54 beneath the memory cell arrays 60a-h and 60i-p, the local word line drivers 64a-d and 64e-h and the n-wells 56a,b, respectively, for the sense amplifiers. As also shown in FIG. 3B, the deep n-wells may not extend beneath the n-well 58 for the row address decoders and global word line drivers, thereby electrically isolating the n-well 58 from the n-wells 56a,b. In one embodiment, the deep n-wells 74a,b may be biased to a voltage Vcc used to supply power to the other components (not shown), and the n-well 58 for the row address decoders and global word line drivers may be biased to Vccp, which may be a voltage having a magnitude that is greater than the magnitude of the supply voltage Vcc. However, the wells 58 and 74a,b may be biased to other voltages in other embodiments. As shown in FIGS. 3A and 3C, the n-well 58, memory cell arrays 60a-h and 60i-p and local word line drivers 64a-d and 64e-h are isolated from each other since the deep n-well 74 shown in FIG. 3B does not extend significantly beyond the portion of the substrate 54 in which the n-wells 56a,b for the sense amplifiers are formed.

Figure 4:
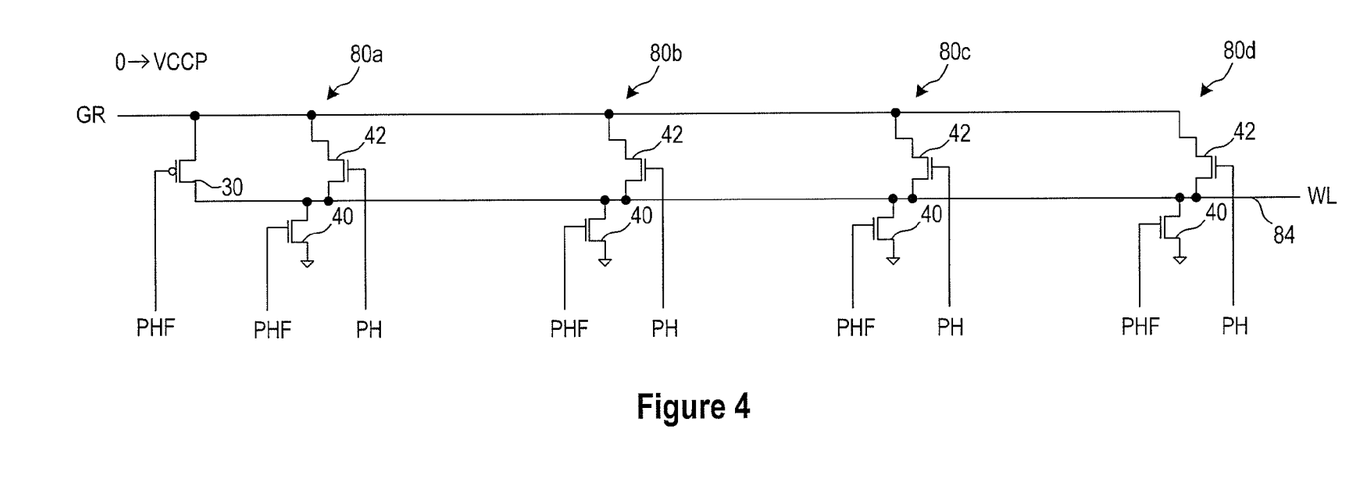
FIG. 4 is a schematic of circuitry comprising a set of local word line drivers according to one embodiment.

One embodiment of a set of local word line drivers 80a-d for a local word line 84 and a coupling PMOS transistor 30 coupled to the local word line 84 is shown in FIG. 4. The local word line drivers 80a-d and a global word line driver 88 (not shown) use some of the same components that are used in the prior art local word line drivers 24a-d and global word line driver 16 shown in FIG. 2. Therefore, in the interest of brevity and clarity, an explanation of their function and operation will not be repeated. Unlike the prior art local word line drivers 24a-h, the local word line drivers 80a-d omit the PMOS transistors 38 (FIG. 2).

In operation, when the PH signal is low and the PHF signal is high, the low PH signal may turn OFF the transistor 42 to isolate the local word line 84 from the global word line GR, and it may turn ON the NMOS transistor 40 to couple the local word line 84 to ground. When the voltage on the global word line GR is low, a high PH signal may turn ON the transistor 42 to couple the local word line 84 to the global word line GR, and it may turn OFF the NMOS transistor 40 to isolate the local word line 84 from ground. Finally, when the voltage on the global word line GR is high, a high PH signal may turn ON the transistor 42 to couple the local word line 84 to the global word line GR until the voltage of the local word line 84 reaches the voltage on the global word line GR less the threshold voltage of the transistor 42. However, to drive the local word line 84 to the full voltage of the global word line GR, the high PH signal may be a voltage that is greater than the voltage to which the global word line GR is driven less the threshold voltage of the NMOS transistor 40. Of course, when the PHF signal is low, the PMOS transistor 30 coupled between the global word line GR and local word line 84 may assist the local word line drivers 80a-d in driving the local word line 84 to the voltage of the global word line GR. In addition to avoiding the need for an n-well for each of the local word line drivers 80a-d, the omission of the PMOS transistors 38 used in the prior art example of FIG. 2 may reduce the number of transistors in each of the local word line drivers 80a-d by one-third, which may allow the local word line drivers 80a-d to consume less area on a semiconductor substrate.

Figure 5:
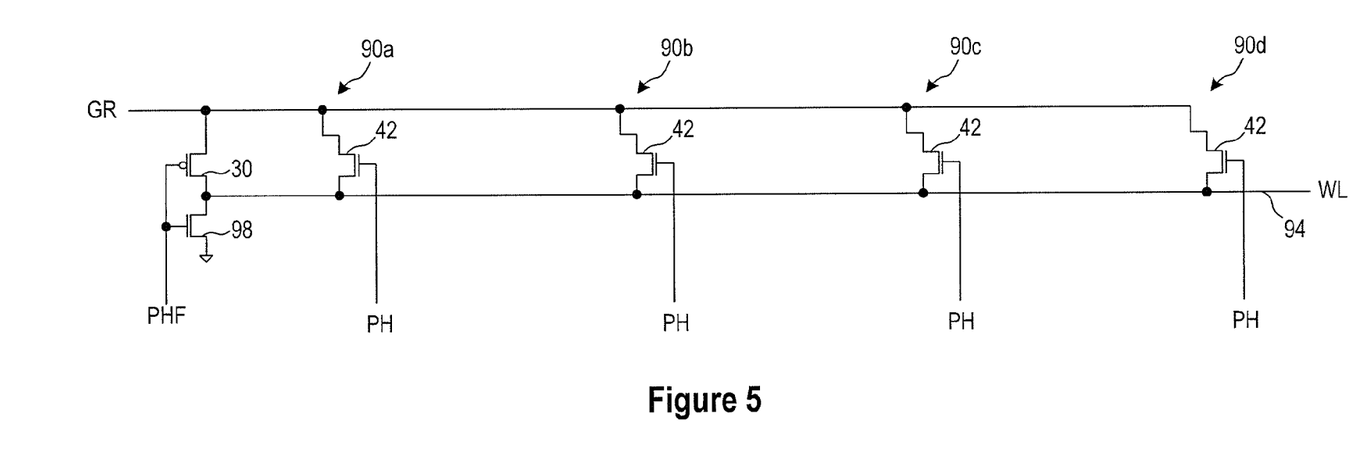
FIG. 5 is a schematic of circuitry comprising a set of local word line drivers according to another embodiment.

Another embodiment of a set of local word line drivers 90a-d for a local word line 94 and transistors 30 and 98 coupled to the local word line 94 is shown in FIG. 5. Again, the local word line drivers 90a-d and a global word line driver 96 (not shown) use some of the same components that are used in the prior art example shown in FIG. 2 and the embodiment of FIG. 4, so an explanation of their function and operation will not be repeated. The local word line drivers 90a-d differ from the local word line drivers 80a-d shown in FIG. 4 by the omission of the NMOS transistors 40, which are used in the local word line drivers 80a-d to drive the local word line 84 to ground. As a result, the local word line drivers 90a-d may consume about half the area on a semiconductor substrate consumed by the local word line drivers 80a-d in the embodiment of FIG. 4. However, the embodiment of FIG. 5 differs from the embodiment of FIG. 4 by the inclusion of a supply voltage NMOS transistor 98, which drives the local word line 94 to ground responsive to a high PHF signal. Although the addition of the NMOS transistor 98 may double the number of transistors used in conjunction with the local word line drivers 90a-d of FIG. 5 compared to the number of transistors used in the embodiment of FIG. 4, the increase in substrate area consumed by the extra transistor 98 may be more than made up for by the decrease in substrate area resulting from omitting the NMOS transistor 40 in each of the local word line drivers 90a-d. Of course, the use of a single transistor 98 to drive the local word line 94 to ground may result in a substantial reduction in the power to drive the local word line 94 low compared to the embodiment of FIG. 4. However, as explained above, since the global word line GR may be driven to ground between each memory access cycle, the NMOS transistor 98 need only maintain the local word line 94 at ground.

Figure 6:
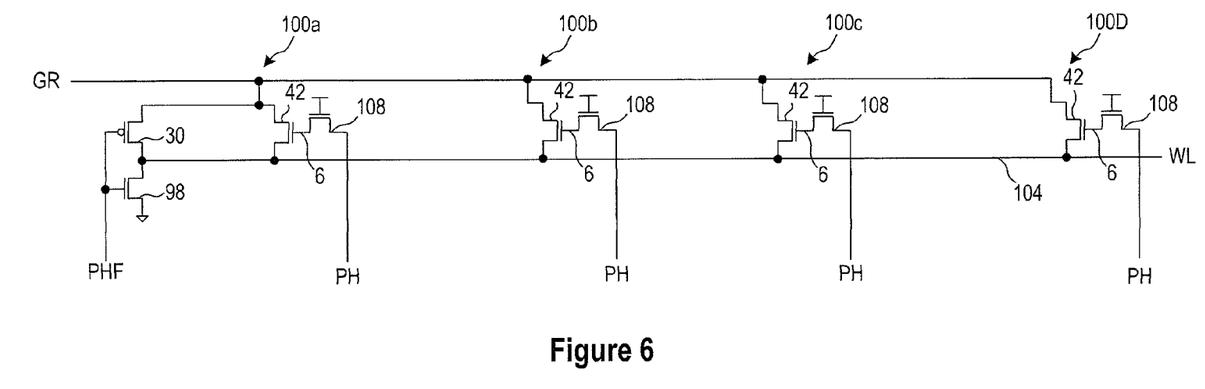
FIG. 6 is a schematic of circuitry comprising a set of local word line drivers according to another embodiment.

Another embodiment of a set of local word line drivers 100a-d for a local word line 104 and transistors 30 and 98 coupled to the local word line 104 is shown in FIG. 6. The transistors 30 and 98 may be identical to the transistors 30 and 98 used in the embodiment of FIG. 5. However, the local word line drivers 100a-d may differ from the local word line drivers 90a-d of FIG. 5 by coupling the PH signal to the gates of the transistors 42 through respective boosting transistors 108 that have their respective gates coupled to a supply voltage, such as a voltage that is the same as the voltage of the global word line GR when it is driven high.

Figure 7:
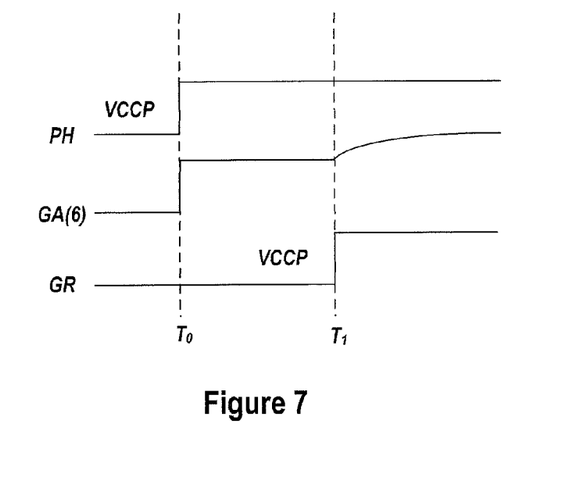
FIG. 7 is a timing diagram showing some of the signals that may be present on a global word line and the set of local word line drivers shown in FIG. 6.

The operation of the local word line drivers 100a-d is essentially the same as the operation of the word line drivers 90a-d except that the transistors 42 may be able to couple the local word line 104 to the full voltage of the global word line GR when the line GR is driven high, although this need not be the case. With reference to FIG. 7, the PH signal may transition high to VCCP at time $t_0$, which is assumed in this example to be the same as the voltage of the global word line GR when the line GR is driven high. As also shown in FIG. 7, the transition of the PH signal may cause a signal GA applied to the gates of the transistors 42 to transition to VCCP less the threshold voltage of the respective transistors 108. After a short time, the global word line GR may transition high at time $t_1$ to VCCP. As shown in FIG. 7, capacitive coupling between the respective drains and gates of the transistors 108 may cause the voltages on the gates of the respective transistors 108 to rise to VCCP plus the threshold voltages of the respective transistors 108. As a result, the transistors 108 may couple the local word line 104 to the full magnitude of VCCP.

Figure 8:
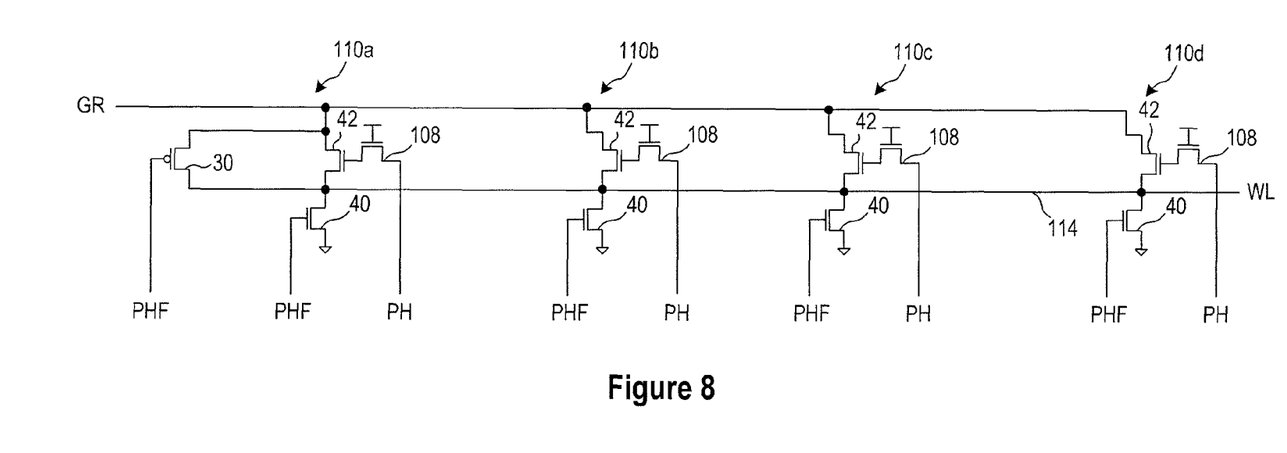
FIG. 8 is a schematic of circuitry comprising a set of local word line drivers according to another embodiment.

Another embodiment of a set of local word line drivers 110a-d for a local word line 114 and a transistor 30 coupled to a local word line 114 is shown in FIG. 8. The local word line drivers 110a-d may be identical to the local word line drivers 100a-d used in the embodiment of FIG. 6 insofar as they may also include the boosting transistors 108. However, the local word line drivers 110a-d may differ from the local word line drivers 100a-d used in the embodiment of FIG. 6 by including the NMOS transistors 40 that are used in the local word line drivers 80a-d of FIG. 4. The use of the NMOS transistors 40 in the local word line drivers 110a-d may allow the NMOS transistor 98 used in the embodiment of FIG. 6 to be omitted since the NMOS transistors 40 may maintain the local word line 104 at ground during each memory access cycle.

Figure 9:
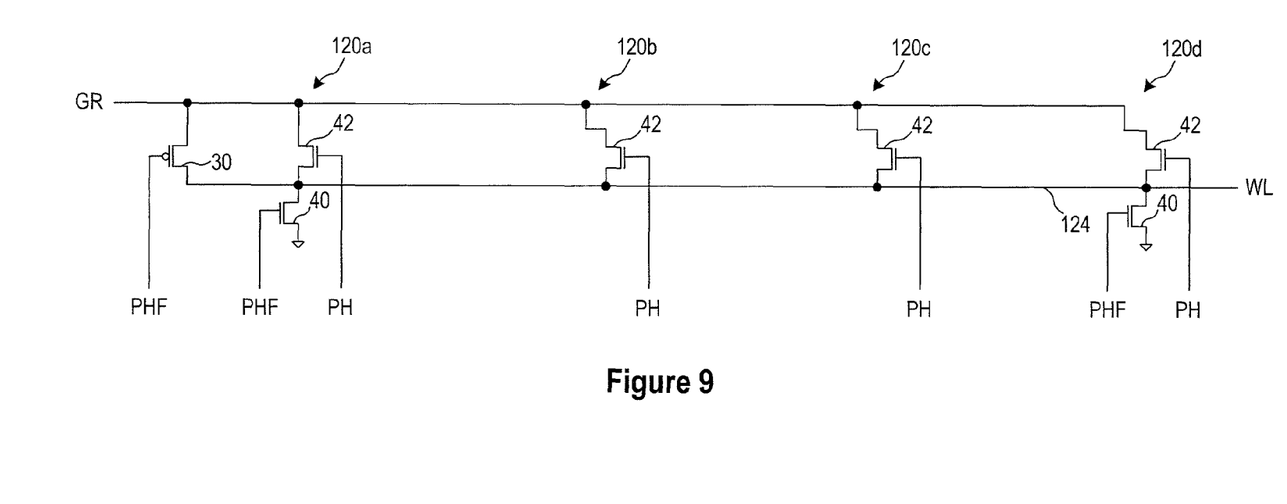
FIG. 9 is a schematic of circuitry comprising a set of local word line drivers according to another embodiment.

Another embodiment of a set of local word line drivers 120a-d for a local word line 124 and a transistor 30 coupled to a local word line 124 is shown in FIG. 9. The local word line drivers 120a-d may be identical to the local word line drivers 80a-d used in the embodiment of FIG. 4, except that the NMOS transistors 40 used in each of the local word line drivers 80a-d of FIG. 4 may be used in only the local word line drivers 120a,d at the ends of an array. The omission of the transistors from the other local word line drivers 120a-d may not adversely affect performance since the NMOS transistors 40 in the two local word line drivers 120a,d may be more than adequate to maintain the local word line 124 at ground insofar as the NMOS transistors 40 are not required to drive the local word line 124 to ground from some higher voltage.

Figure 10:
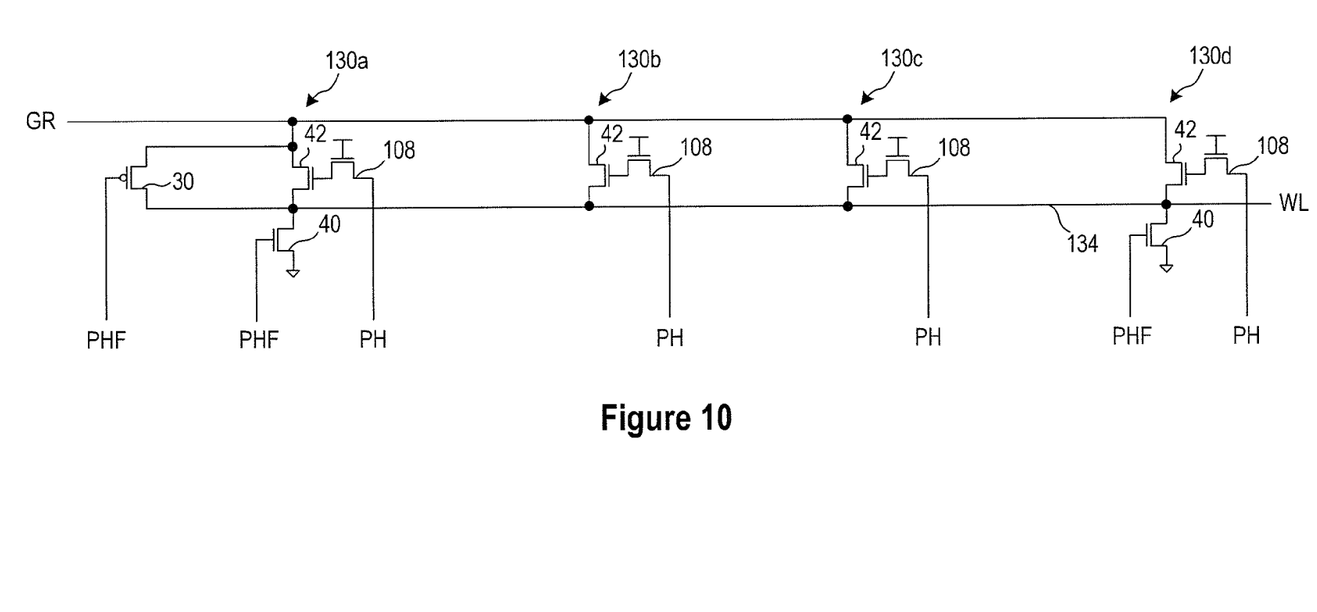
FIG. 10 is a schematic of circuitry comprising a set of local word line drivers according to another embodiment.

Another embodiment of a set of local word line drivers 130a-d for a local word line 134 and a transistor 30 is shown in FIG. 10. The local word line drivers 130a-d may be identical to the local word line drivers 110a-d used in the embodiment of FIG. 8 except that the NMOS transistors 40 used in all of the local word line drivers 110a-d of FIG. 8 are used in only the local word line drivers 130a,d at the ends of an array.

Figure 11:
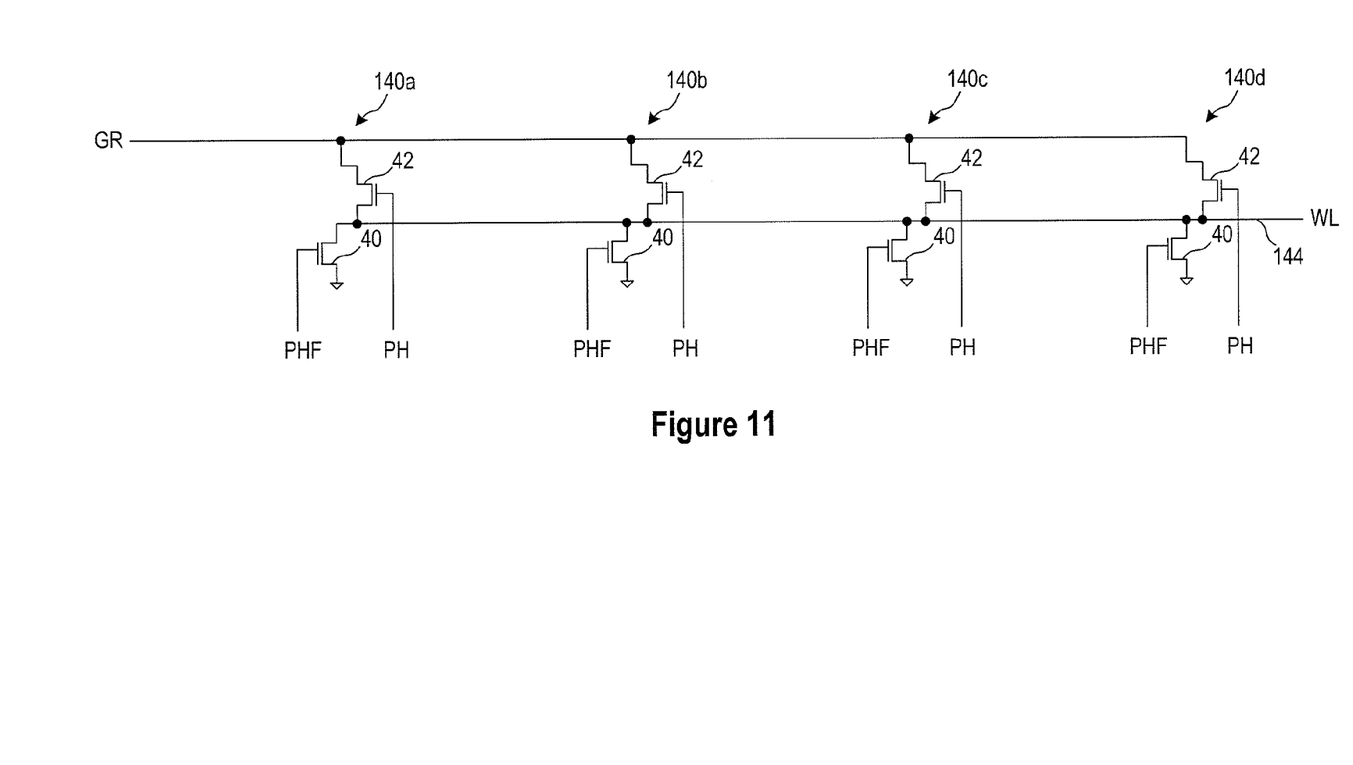
FIG. 11 is a schematic of circuitry comprising a set of local word line drivers according to an embodiment of the invention.

Another embodiment of a set of local word line drivers 140a-d for a local word line 144 is shown in FIG. 11. The local word line 144 is coupled through the local word line drivers 140a-d to a global word line GR, to which a global word line driver 146 (not shown) is also coupled. The local word line drivers 140a-d and the global word line driver 146 use some of the same components that are used in the prior art example shown in FIG. 2 and the embodiment of FIG. 4, so an explanation of their function and operation will not be repeated. Unlike the embodiment of FIG. 4, however, the embodiment of FIG. 11 may omit the transistor 30. The local word line drivers 140a-d include transistors 42 coupled to the global word line GR and the local word line 144 and further include transistors 40 coupled to the local word line 144 and a supply voltage node, for example, ground. The transistors 40 and 42 may be NMOS transistors, as shown for the embodiment of FIG. 11. A signal PH is provided to the transistor 42 and a complement signal PHF is provided to the transistor 40.

In operation, the local word line drivers 140a-d may be operated similarly to the local word line drivers 80a-d previously described with reference to FIG. 4. In some embodiments, a high logic level PH signal provided to the transistors 42 may have a voltage that is greater than the voltage of the global word line GR by more than the threshold voltage of the transistor 40. As a result, the full voltage of the global word line GR may be provided through the transistors 42 to the local word line 144. The embodiment of FIG. 11 may reduce the number of transistors of the local word line drivers in comparison to conventional designs, for example, shown in FIG. 2. Additionally, the configuration of FIG. 11 may avoid the need for an n-well for each of the local word line drivers 140a-d.

Moreover, as previously mentioned, the embodiment illustrated in FIG. 11 may omit the transistor 30 in the embodiment of FIG. 4. This may alter the swing voltage necessary to couple Vccp from the global word line GR to the local word line 144. In at least one embodiment, the swing voltage required to couple Vccp may be greater than the swing voltage necessary to couple Vccp in the embodiment of FIG. 4. For example, the embodiment in FIG. 4 may require a swing voltage of 3.15V and the embodiment of FIG. 11 may require 4.15V.

Figure 12:
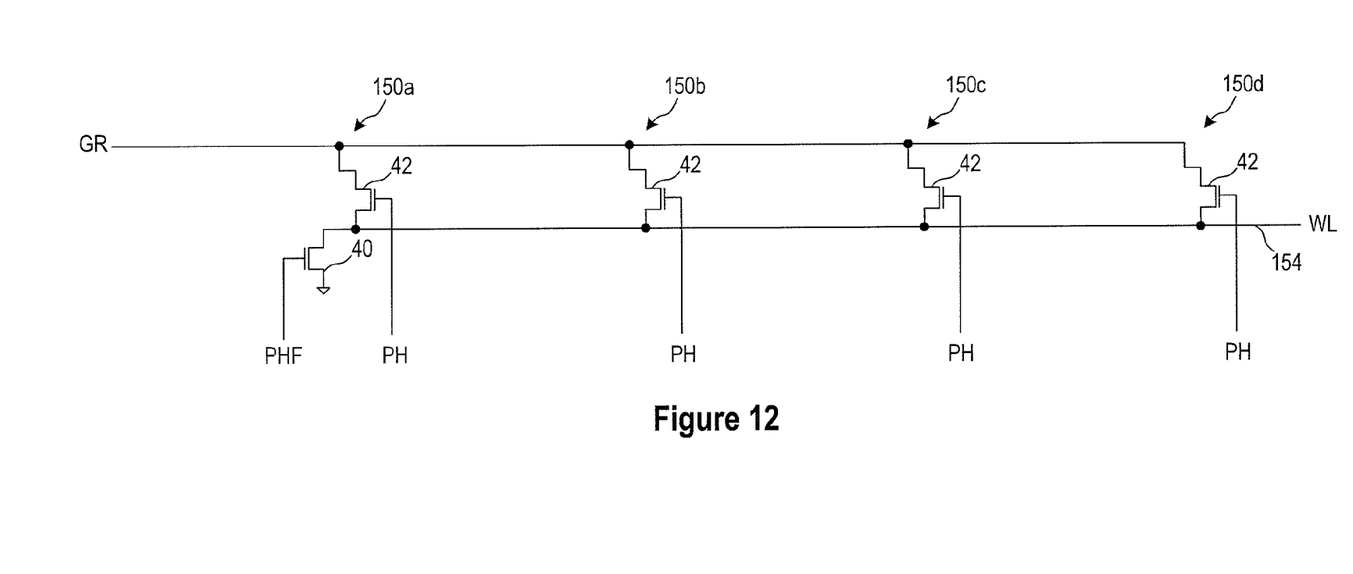
FIG. 12 is a schematic of circuitry comprising a set of local word line drivers according to another embodiment of the invention.

Another embodiment of a set of local word line drivers 150a-d for a local word line 154 is shown in FIG. 12. The local word line 154 is coupled through the local word line drivers 150a-d to a global word line GR. The local word line drivers 150a-d may be identical to the local word line drivers 140a-d used in the embodiment of FIG. 11 except that an NMOS transistor 40 used in the local word line drivers 140a,d of FIG. 11 may be used only in the local word line driver 150a at a single end of the array. The local word line drivers 150a-d may include transistors 42 coupled to the global word line GR and the local word line 154. Local word line driver 150a further includes transistor 40 coupled to the local word line and a supply voltage node. In at least one embodiment, the supply voltage node may be ground, and transistors 40 and 42 may be NMOS transistors, as illustrated in FIG. 12. A signal PH may be provided to the transistor 42 and a complement signal PHF may be provided to the transistor 40.

In operation, the local word line drivers 150a-d may be operated similarly to the local word line drivers 140a-d described with reference to FIG. 11. In at least one embodiment, a high logic level signal PH may be provided to transistors 42 and have a voltage greater than the voltage of the global word line GR by more than the threshold voltage of the transistor 40. Consequently, the full voltage of the global word line GR may be provided to the local word line 154 through the transistors 42. The embodiment shown in FIG. 12 may reduce the number of transistors used in comparison to other designs, including that of FIG. 11.

Figure 13:
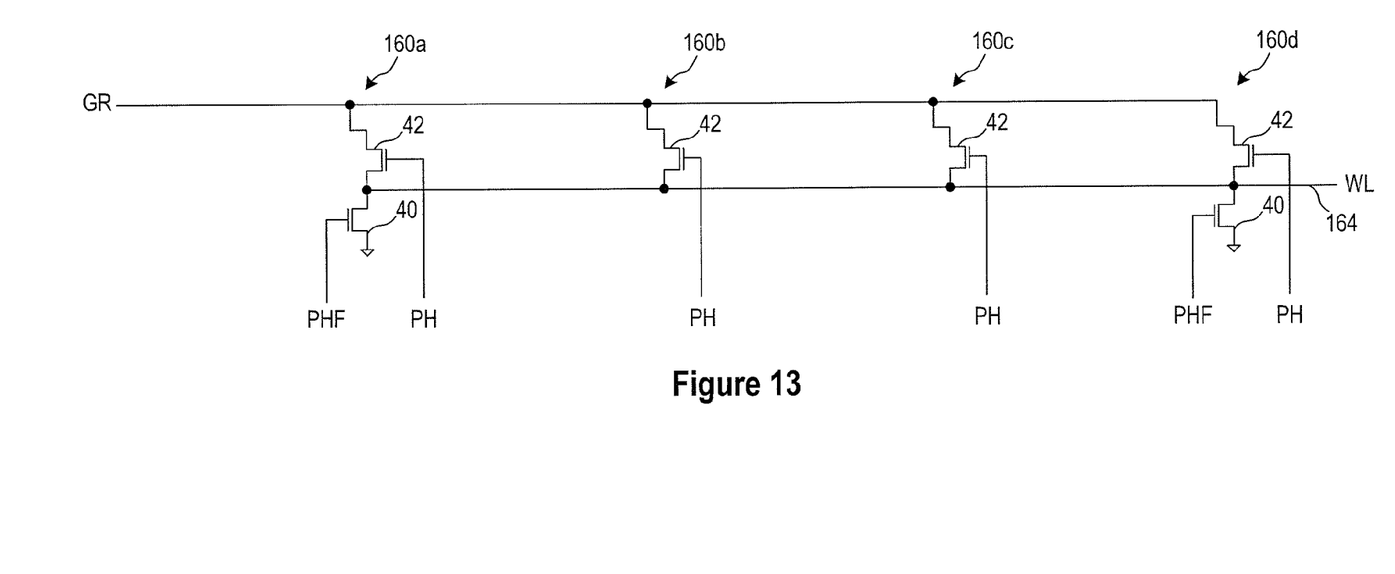
FIG. 13 is a schematic of circuitry comprising a set of local word line drivers according to another embodiment of the invention.

Another embodiment of a set of local word line drivers 160a-d for a local word line 164 is shown in FIG. 13. The local word line drivers 160a-d may be identical to the local word line drivers 140a-d used in the embodiment of FIG. 11 except that the NMOS transistors 40 used in all of the local word line drivers 140a-d of FIG. 11 are used in only the local word line drivers 160a,d at the ends of an array.

Figure 14:
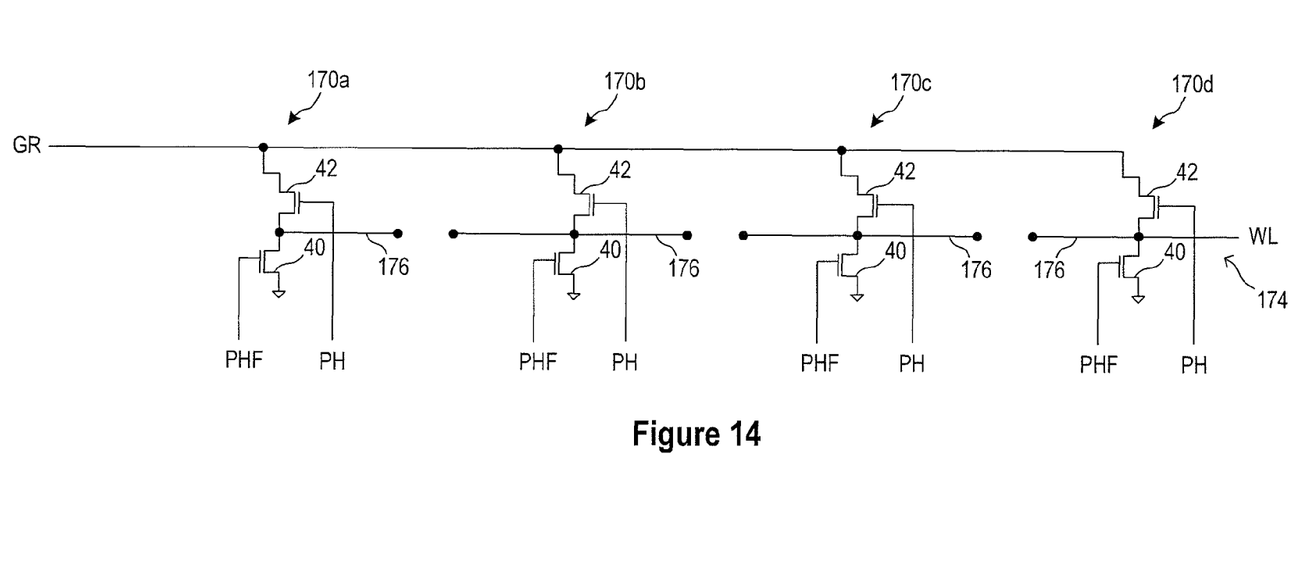
FIG. 14 is a schematic of circuitry comprising a set of local word line drivers according to an embodiment of the invention.

Finally, another embodiment of a set of local word line drivers 170a-d for a local word line 174 is shown in FIG. 14. The local word line drivers 170a-d may be identical to the local word line drivers 80a-d used in the embodiment of FIG. 4. However, the word line 174 may differ from the local word line 84 shown in FIG. 4 in that the word line 174 comprises a set of word line segments 176a-d that are coupled to the global word line GR by transistors 170a-d, respectively. In one embodiment, such as that illustrated in FIG. 14, each segment may correspond to a local word line driver 170. In other embodiments, any number of segments 176 may be used and any number of segments 166 and local word line drivers 170 may correspond to one another.

In operation, the local word line drivers 170a-d may be operated similarly to the local word line drivers 80a-d described with reference to FIG. 4. In at least one embodiment, a high logic level signal PH may be provided to transistors 42 and have a voltage greater than the voltage of the global word line GR by more than the threshold voltage of the transistor 40. Consequently, the full voltage of the global word line GR may be provided to each segment 176 of the local word line 174 through the transistors 42.

Figure 15:
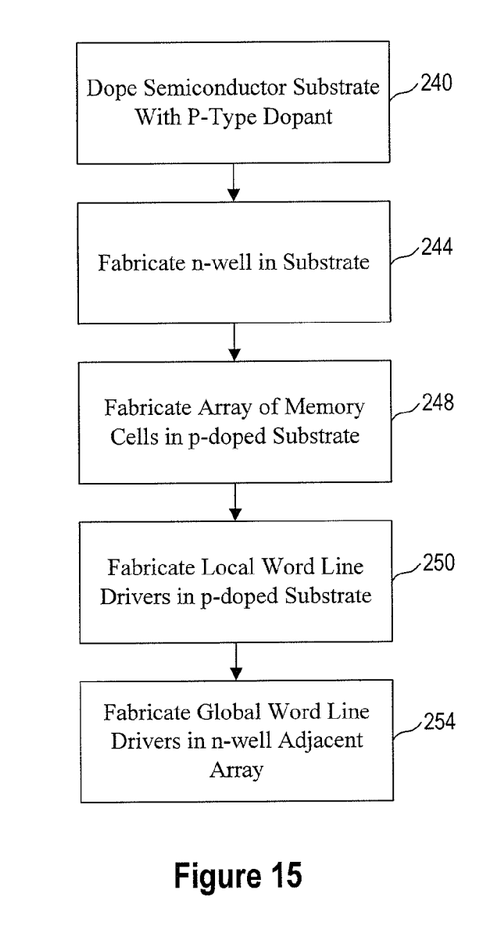
FIG. 15 is flow chart showing an embodiment of a method for fabricating a memory subsystem, including local word line drivers, according to one embodiment.

A method of fabricating a semiconductor memory subsystem according to one embodiment is shown in FIG. 15. The method may be initiated at 240 by doping a semiconductor material (e.g., a substrate) with a p-type dopant. Next, at 244, an n-well may be formed in the substrate. An array of memory cells may then be formed over the p-doped semiconductor substrate at 248, which may include forming transistors and word lines in the array. All of the transistors in the array are formed as n-type transistors. Next, at 250, a plurality of local word line drivers are formed using the p-doped semiconductor substrate, which may include forming at least one transistor for each of the local word line drivers. All of the transistors formed at 250 may be n-type transistors. Each of the local word line drivers formed at 250 may be coupled to a respective one of the word lines. Finally, at 254, a plurality of global word line drivers may be formed using an n-well, such as the n-well adjacent to the array of memory cells and/or an edge n-well. Each of the global word line drivers formed at 254 may include at least one p-type transistor, and it may be coupled to a respective one of the word lines.

Although the present invention has been described with reference to the disclosed embodiments, persons skilled in the art will recognize that changes may be made in form and detail without departing from the invention. For example, although the embodiments have been explained with respect to NMOS transistors being the only transistors used in the local word line drivers, it will be understood that, in other embodiments, PMOS transistors may be substituted for NMOS embodiments and vice-versa, in which case the memory cells arrays and local word line drivers may be fabricated in an n-type substrate rather than a p-type substrate. Such modifications are well within the skill of those ordinarily skilled in the art. Accordingly, the invention is not limited except as by the appended claims.

We claim:

1. A memory subsystem, comprising:
   semiconductor material of a first type;
   an array of memory cells;
   a set of local word line drivers formed using the semiconductor material of the first type, each of the local word line drivers in the set being coupled to a word line extending through the array of memory cells, each of the local word line drivers including at least one transistor, each of the at least one transistor of each of the local word line drivers being a transistor of a second type;
   a well of semiconductor material of a second type formed in the semiconductor material of the first type; and
   a global word line driver coupled to the word line extending through the array of memory cells, the global word line driver including a transistor of a first type formed using the well of the semiconductor material of the second type.

2. The memory subsystem of claim 1 wherein the material of the first type comprises a p-type substrate, the transistor of the second type comprises an NMOS transistor, the material of the second type comprises a n-type material, and the transistor of the first type comprises a PMOS transistor and further wherein:
   the at least one NMOS transistor of each of the local word line drivers comprises a first NMOS transistor having its drain and source coupled between a global word line and the word line extending through the array of memory cells, the first NMOS transistor having a gate coupled to receive a first control signal; and
   the transistor of the first type of the global word line driver comprises a first PMOS transistor formed using the well of n-type semiconductor material, the first PMOS transistor having its drain and source coupled between a first supply voltage and the global word line the first PMOS transistor having a gate coupled to receive a global control signal.

3. The memory subsystem of claim 2, wherein each of the local word line drivers includes only one NMOS transistor.

4. The memory subsystem of claim 2 wherein the at least one NMOS transistor of at least one of the local word line drivers further comprises a second NMOS transistor having its drain and source coupled between a voltage supply node and the word line extending through the array of memory cells, the second NMOS transistor having a gate coupled to receive the second control signal.

5. The memory subsystem of claim 4, wherein only one of the at least one NMOS transistor of at least one of the local word line drivers comprises the second NMOS transistor.

6. The memory subsystem of claim 4, wherein the at least one local word line driver is adjacent to an end of the array of memory cells.

7. The memory subsystem of claim 4, wherein the at least one local word line driver comprises first and second local word line drivers, the first and second local word line drivers located adjacent to first and second ends of the array, respectively.

8. The memory subsystem of claim 2 wherein the global word line driver further comprises a second NMOS transistor having its drain and source coupled between a voltage supply node and the global word line, the second NMOS transistor having a gate coupled to receive the global control signal.

9. The memory subsystem of claim 2 wherein the at least one NMOS transistor of each of the local word line driver further comprises a boosting NMOS transistor having its gate coupled to a voltage supply node, the second PMOS boosting transistor being configured to couple the first control signal to the gate of the respective first NMOS transistor.

10. The memory subsystem of claim 1 wherein each of the cells in the array is coupled to a respective one of a plurality of access transistors and wherein all of the access transistors comprise NMOS transistors.

11. The memory subsystem of claim 1, wherein the word line comprises a plurality of word line segments.

12. The memory subsystem of claim 1, wherein each of the local word line drivers comprise only one transistor.

13. The memory subsystem of claim 1, wherein:
    the at least one transistor of each of the local word line drivers comprises a first transistor of the second type having its drain and source coupled between a global word line extending through the plurality of arrays of memory cells and the word line extending through the plurality of arrays of memory cells, the transistor of the second type having a gate coupled to receive a first control signal.

14. The memory subsystem of claim 13, wherein at least one of the local word line drivers further comprises a second transistor of the second type having its drain and source coupled between a voltage supply node and the word line extending through the array of memory cells, the second transistor having a gate coupled to receive a second control signal that is complementary with the first control signal.

15. The memory subsystem of claim 14, further comprising: a coupling transistor of the first type having its drain and source coupled between the global word line and the word line extending through the array of memory cells, the coupling transistor of the first type having a gate coupled to receive the second control signal.

16. The memory subsystem of claim 15, wherein the single local word line driver is located adjacent an end of the array.

17. The memory subsystem of claim 15, further comprising:
    a supply voltage transistor of the second type having its drain and source coupled between a voltage supply node and the word line extending through the array of memory cells, the voltage supply transistor of the second type having a gate coupled to receive the second control signal.

18. The memory subsystem of claim 14, wherein the at least one of the local word line drivers comprises a single local word line driver.

19. The memory subsystem of claim 14, wherein the at least one of the local word line drivers comprises a first local word line driver and a second word line driver located adjacent first and second ends of the array, respectively.

20. The memory subsystem of claim 13 wherein the at least one transistor of each of the local word line drivers further comprises a boosting transistor of the second type having its gate coupled to a voltage supply node, the boosting transistor being configured to couple the first control signal to the gate of the respective first transistor of the second type.

21. The memory subsystem of claim 13 further comprising a plurality of row decoders formed using the well of semiconductor material of the second type.

22. The memory subsystem of claim 13, wherein the first transistor of the second type of each of the local word line drivers is the only transistor of each of the local word line drivers.

23. The memory subsystem of claim 13, wherein the transistor of the second type of each of the local world line drivers is the only transistor of each of the local word line drivers.

24. The memory subsystem of claim 1 wherein each of the local word line drivers comprise:
a first transistor of the second type coupled to the word line extending through the plurality of arrays of memory cells and a global word line coupled to the global word line driver; and
a second transistor of the second type coupled between the word line extending through the plurality of arrays of memory cells and a supply voltage node.

25. The memory subsystem of claim 1 wherein the global word line driver is coupled to the word line extending through the plurality of arrays of memory cells through a global word line, wherein a single one of the at least one transistor of each of the local word line drivers is coupled between the global word line and the word line extending through the plurality of arrays.

26. A memory subsystem, comprising:
a semiconductor material of a first type;
an array of memory cells;
a set of local word line drivers formed using the semiconductor material of the first type and coupled to a word line extending through the array of memory cells, individual ones of the set of local word line drivers including a first transistor of a first type;
a well of semiconductor material of a second type formed in the semiconductor material of the first type; and
a global word line driver formed using the well of semiconductor material of the second type,
wherein individual ones of the set of local word line drivers do not include a transistor of the second type.

27. The memory system of claim 26, wherein individual ones of the set of local word line drivers are coupled to a respective set of word line segments.

28. The memory system of claim 26, wherein the semiconductor material of the first type comprises a substrate of a first type and the semiconductor material of the second type comprises comprise a well of semiconductor material of a second type.

29. The memory system of claim 28, wherein the semiconductor material of a first type is a p-type semiconductor material and the semiconductor material of a second type is an n-type semiconductor material formed in the p-type semiconductor material.

30. The memory system of claim 26, wherein at least one local word line driver of the set includes a third transistor of the first type and the first and third transistors of the first type of the at least one local word line driver of the set are coupled in series.

31. The memory system of claim 30, wherein the third transistor of the first type is configured to maintain the word line at a particular voltage responsive to a global word line being driven to the particular voltage.

32. The memory system of claim 30, wherein the at least one local word line driver of the set including the third transistor comprises a local wordline driver of the set located at an end of the array.

33. A method of activating a word line, comprising:
providing a voltage to a global word line with a global word line driver formed using a semiconductor material of a second type; and
providing the voltage to a local word line with at least one local word line driver formed using a semiconductor material of a first type;
wherein the local word line drivers include only transistors of a single type and wherein providing the voltage to the local word line comprises coupling the voltage to the local word line using the at least one local word line driver, wherein the coupling occurs responsive, at least in part, to receipt of at least one of a control signal and a complementary signal.

34. The method of claim 33, further comprising:
electrically isolating the local word line from the global word line.

35. The method of claim 33, wherein the semiconductor material of a first type is a p-type substrate and the semiconductor material of a second type is a n-type semiconductor material.

36. The method of claim 33, wherein the voltage is a pumped supply voltage.

37. The method of claim 33, wherein transistors of a single type are NMOS transistors.

38. The method of claim 33, wherein the local word line is segmented.

* * * * *

UNITED STATES PATENT AND TRADEMARK OFFICE
CERTIFICATE OF CORRECTION

| | |
|---|---|
| PATENT NO. | : 8,737,157 B2 |
| APPLICATION NO. | : 13/298104 |
| DATED | : May 27, 2014 |
| INVENTOR(S) | : Tae Kim et al. |

Page 1 of 1

It is certified that error appears in the above-identified patent and that said Letters Patent is hereby corrected as shown below:

In the Claims:

In column 12, lines 6-7, in Claim 28, delete "comprises comprise" and insert -- comprises --, therefor.
In column 12, line 26, in Claim 32, delete "wordline" and insert -- word line --, therefor.

Signed and Sealed this
Twelfth Day of August, 2014

Michelle K. Lee
*Deputy Director of the United States Patent and Trademark Office*